(12) United States Patent
Yabuta et al.

(10) Patent No.: US 8,487,266 B2
(45) Date of Patent: Jul. 16, 2013

(54) X-RAY DETECTOR AND METHOD FOR MANUFACTURING THE SAME

(75) Inventors: Hisato Yabuta, Machida (JP); Nobuyuki Kaji, Kawasaki (JP); Ryo Hayashi, Yokohama (JP); Masatoshi Watanabe, Isehara (JP); Taihei Mukaide, Atsugi (JP); Kazunori Fukuda, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 367 days.

(21) Appl. No.: 12/984,515

(22) Filed: Jan. 4, 2011

(65) Prior Publication Data
US 2011/0168905 A1 Jul. 14, 2011

(30) Foreign Application Priority Data
Jan. 14, 2010 (JP) ................................. 2010-006233

(51) Int. Cl.
*G01T 1/24* (2006.01)
(52) U.S. Cl.
USPC ................................. 250/370.09; 250/370.12
(58) Field of Classification Search
USPC ........................................ 250/390.09, 390.12
See application file for complete search history.

(56) References Cited

U.S. PATENT DOCUMENTS

| 7,535,010 B2 * | 5/2009 | Saito et al. ............... 250/370.09 |
| 7,663,116 B2 | 2/2010 | Saito et al. |
| 2008/0290286 A1 | 11/2008 | Saito et al. |
| 2010/0140609 A1 * | 6/2010 | Yano et al. ....................... 257/43 |

FOREIGN PATENT DOCUMENTS

| JP | 2001-503570 T | 3/2001 |
| JP | 2006-049773 A | 2/2006 |
| JP | 2006-346290 A | 12/2006 |

OTHER PUBLICATIONS

Endo et al., "Fabrication and Characterization of a ZnO X-Ray Sensor Using a High-Resistivity ZnO Single Crystal Grown by the Hydrothermal Method", Nuclear Instruments and Methods in Physics Research A 665 (2011): p. 15-18.*

* cited by examiner

*Primary Examiner* — Casey Bryant
(74) *Attorney, Agent, or Firm* — Canon U.S.A., Inc. IP Division

(57) ABSTRACT

An X-ray detector includes an X-ray photoelectric conversion layer configured to produce electric charges in proportion to X-ray irradiation incident on the layer, a collecting electrode configured to collect the electric charges produced by the X-ray photoelectric conversion layer, a common electrode disposed on a surface of the X-ray photoelectric conversion layer opposite to the collecting electrode, a storage capacitor configured to store the electric charges collected by the collecting electrode, and a readout unit configured to read out the electric charges stored in the storage capacitor. A voltage is to be applied between the collecting electrode and the common electrode. The X-ray photoelectric conversion layer is formed of a polycrystalline oxide.

10 Claims, 5 Drawing Sheets

X-RAY DETECTOR AND METHOD FOR MANUFACTURING THE SAME

BACKGROUND OF THE INVENTION

1. Field of the Invention

The present invention relates to a detector that can detect X-ray irradiation. More particularly, the present invention relates to a detector array that can one- or two-dimensionally measure the X-ray irradiation dose.

2. Description of the Related Art

X-ray techniques are widely used in medical examination and industrial inspection, in which a human body or a substance is irradiated with X-rays to acquire information about the inside of the human body or the substance from the absorption contrast of penetrating X-rays. Although photographic plates and imaging plates were widely used in the past to obtain transmission X-ray images, they have recently been replaced by two-dimensional X-ray detectors, in which the penetrating X-ray intensity is converted into electronic information. X-ray detectors are classified into an indirect conversion type and a direct conversion type. In the X-ray detectors of the indirect conversion type, X-rays are converted into visible light and subsequently into electronic information. In the X-ray detectors of the direct conversion type, X-rays are directly converted into electronic information. Although the present mainstream X-ray detectors are of the indirect conversion type, there is a demand for X-ray detectors of the direct conversion type that can produce high-quality images.

Improvement in the performance of X-ray detectors of the direct conversion type requires improvement in the sensitivity of an X-ray photoelectric conversion layer, which converts X-rays into electrons. X-ray photoelectric conversion layers in X-ray detectors of the direct conversion type are formed of amorphous selenium or polycrystalline Cadmium Telluride (CdTe). X-ray photoelectric conversion layers having higher sensitivity to X-rays are being developed to improve the performance of X-ray detectors. More specifically, these photoelectric conversion layers can be formed of bismuth oxide, CdTe single crystals, or lead iodide or thallium iodide, as disclosed in Japanese Patent Application Laid-Open No. 2006-49773.

However, conventional techniques for manufacturing X-ray detectors are seen to have several limitations as follows:

First: A process of forming an X-ray photoelectric conversion layer takes a long period of time. In order to improve the efficiency of absorbing X-rays, an X-ray photoelectric conversion layer must have a thickness in the range of several hundreds of microns to approximately 1 mm. The formation of such a thick film by a deposition method, such as vapor deposition, requires a long period of time and possibly increases manufacturing costs. The formation of an X-ray photoelectric conversion layer by a sol-gel method requires high temperature, often resulting in the deterioration and degradation of other components and lowering the yield.

Second: Selenium or iodine in known photoelectric conversion layers often reacts with another component of the detector, such as an electrode, causing the corrosion and deterioration of the component. This also lowers the yield.

Third: Use of single crystals, such as CdTe single crystals, in the X-ray photoelectric conversion layer entails increased costs due to their very high prices.

Fourth: Use of polycrystals, such as CdTe polycrystals, to solve the third problem results in a low yield of another component, such as a thin-film transistor (hereinafter also referred to as a "TFT"), directly formed on the polycrystals because, unlike amorphous films or single crystals, the polycrystals have a rough surface. Thus, in order to improve the yield, two substrates on which a TFT and an X-ray photoelectric conversion layer are formed separately are bonded together. However, the bonding process can also increase manufacturing costs.

Fifth: The formation of an X-ray photoelectric conversion layer having a thickness in the range of several hundreds of microns to 1 mm as described above requires the application of a high voltage (in the order of several thousands of volts) to the X-ray photoelectric conversion layer.

Sixth: Conventional X-ray detectors of the direct conversion type cannot acquire information about X-rays having different wavelengths. In other words, conventional X-ray detectors of the direct conversion type only acquire information about an X-ray having a single wavelength.

SUMMARY OF THE INVENTION

In order to address the first to third limitations of the conventional technology, as highlighted above, in accordance with one aspect of the present invention, a polycrystalline oxide sheet produced from a polycrystalline powder is used as an X-ray photoelectric conversion layer. Other components, such as a TFT and a storage capacitor, are formed on the polycrystalline oxide sheet.

In order to solve the fourth conventional limitation, in accordance with one aspect of the present invention, a surface planarization layer is formed, for example, with an organic substance on the surface of a polycrystalline oxide. Other components, such as a TFT, are formed on the surface planarization layer.

In order to solve the fifth limitation, in accordance with one aspect of the present invention, a plurality of polycrystalline oxide sheets are stacked, and electrodes disposed between the polycrystalline oxide sheets are alternately connected on the opposite sides of the polycrystalline oxide sheets. Thus, the electrodes are stacked in a staggered form. A voltage is applied between the opposite sides.

For example, a first electrode is formed between a first polycrystalline oxide sheet and a second polycrystalline oxide sheet, and a second electrode is formed between the second polycrystalline oxide sheet and a third polycrystalline oxide sheet. A third electrode is formed between the third polycrystalline oxide sheet and a fourth polycrystalline oxide sheet, and a fourth electrode is formed between the fourth polycrystalline oxide sheet and a fifth polycrystalline oxide sheet. The first electrode is connected to the third electrode on the left side of the polycrystalline oxide sheets, and the second electrode is connected to the fourth electrode on the right side of the polycrystalline oxide sheets. A voltage is applied between the first electrode and the third electrode and between the second electrode and the fourth electrode.

To address the sixth limitation of conventional techniques, in accordance with one aspect of the present invention, a plurality of polycrystalline oxide sheets are stacked, and at least one layer formed of a substance having a higher density than the polycrystalline oxide sheets (hereinafter also referred to as a "high-density substance layer") is formed between the polycrystalline oxide sheets. A pair of electrodes formed on the opposite sides of a polycrystalline oxide sheet disposed above the high-density substance layer and another pair of electrodes formed on the opposite sides of a polycrystalline oxide sheet disposed below the high-density substance layer are connected to their respective storage capacitors.

For example, a first polycrystalline oxide sheet is formed between a first electrode and a second electrode, a high-density substance layer is formed between the second electrode and a third electrode, and a second polycrystalline oxide sheet is formed between the third electrode and a fourth electrode. The first electrode is connected to a first storage capacitor, and the fourth electrode is connected to a second storage capacitor.

Since polycrystalline oxides are stable, use of a polycrystalline oxide in an X-ray photoelectric conversion layer of an X-ray detector does not cause the deterioration or corrosion of other components, such as an electrode. The formation of a polycrystalline oxide sheet from a polycrystalline powder in advance facilitates the formation of an X-ray photoelectric conversion layer having a sufficient thickness. A process of producing a polycrystalline oxide powder and a process of forming a sheet from the polycrystalline oxide powder require high temperature. However, a process of forming other components on the polycrystalline oxide sheet serving as a substrate does not require high temperature.

The formation of a surface planarization layer, for example, formed of an organic substance on a surface of a polycrystalline oxide and the formation of other components, such as a storage capacitor and a TFT, on the surface planarization layer obviate the necessity of using a smooth single-crystal substrate, thereby reducing the manufacturing costs of the X-ray detector.

Electrodes disposed between the polycrystalline oxide sheets are alternately connected on the opposite sides of the polycrystalline oxide sheets. A voltage is applied between the opposite sides. Such a structure can reduce the effective thickness of a unit including a polycrystalline oxide sheet between two electrodes, that is, the interelectrode distance and increase the effective electrode area. This can reduce the interelectrode voltage. In addition, an increase in effective electrode area can improve the X-ray detectivity.

At least one high-density substance layer is disposed between layered polycrystalline oxide sheets. A pair of electrodes formed on a polycrystalline oxide sheet disposed above the high-density substance layer and another pair of electrodes formed on a polycrystalline oxide sheet disposed below the high-density substance layer are connected to their respective storage capacitors. Thus, an element including a polycrystalline oxide sheet above the high-density substance layer and an element including a polycrystalline oxide sheet below the high-density substance layer can act as independent X-ray detector elements. An X-ray detector element away from an X-ray source detects an X-ray having a shorter wavelength (high energy) than an X-ray detector element closer to the X-ray source. Thus, the comparison of the intensities of the two X-ray detector elements can yield information based on the wavelength component of the X-rays (information based on a long wavelength and information based on a short wavelength) and can yield information about the element components and the density of the analyte of the X-ray examination.

Further features of the present invention will become apparent to persons having ordinary skill in the art from the following description of exemplary embodiments with reference to the attached drawings.

DESCRIPTION OF THE EMBODIMENTS

Preferred embodiments of the present invention will be described below with reference to the drawings. However, the present invention is not limited to these embodiments.

Figure 2:
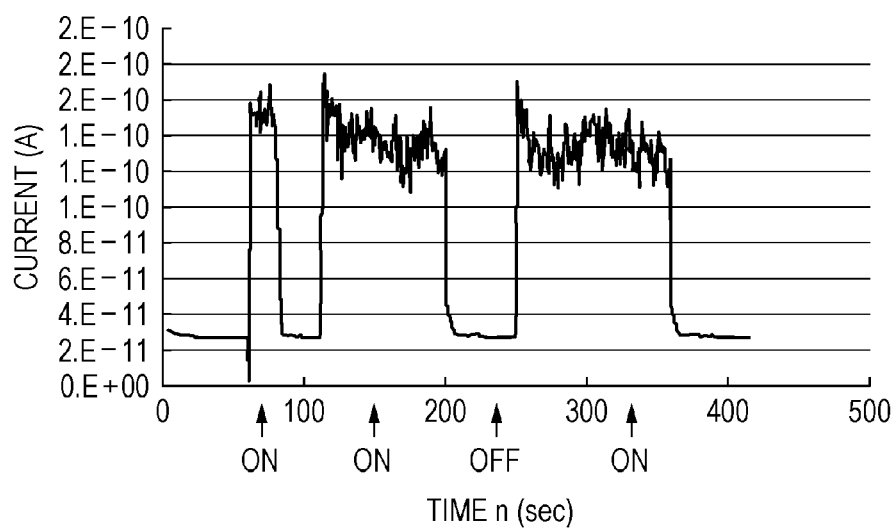
FIG. 2 is a graph showing the X-ray detection current of an X-ray detector containing layered polycrystalline oxide sheets during X-ray irradiation and the suspension of irradiation.

Use of a polycrystalline oxide as an X-ray photoelectric conversion layer will be described below. A polycrystalline ceramic powder mainly composed of zinc oxide is formed into a polycrystalline oxide sheet. The polycrystalline oxide sheet is used as an X-ray photoelectric conversion layer. An electrode is formed on the opposite surfaces of the X-ray photoelectric conversion layer. The electric current during X-ray irradiation is measured. As shown in FIG. 2, the X-ray sensitivity is sufficient for detection (the applied voltage=+2 V).

Figure 3:
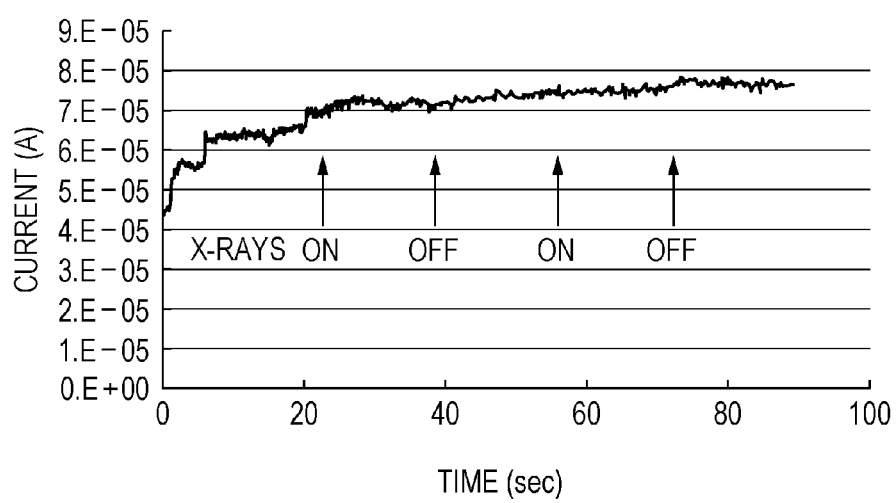
FIG. 3 is a graph showing the X-ray detection current of an X-ray detector containing layered polycrystalline oxide sheets during X-ray irradiation and the suspension of irradiation.

As illustrated in FIG. 3, an increase in applied voltage (the applied voltage=+20 V) results in a decrease in the difference between the detection current during X-ray irradiation and the detection current during the suspension of irradiation. This proves that the detection current results from the grain boundary barrier, such as the Schottky barrier. Thus, the X-ray photoelectric conversion layer containing a polycrystal can detect X-rays by a mechanism different from the detection mechanism in a single crystal or an amorphous substance. The detection mechanism in a single crystal or an amorphous substance involves electron-hole pair production during X-ray irradiation. The present examples employ a low-resistance oxide probably having low X-ray detectivity due to electron-hole pair production. Thus, only a detection current from the grain boundary barrier is observed. However, use of polycrystalline oxide grains formed of a substance having high X-ray detectivity due to electron-hole pair production can improve the X-ray detectivity.

EXAMPLES

While the present invention will be further described in the following examples, it is to be understood that the present invention is not limited to these examples.

Example 1

Figure 1:
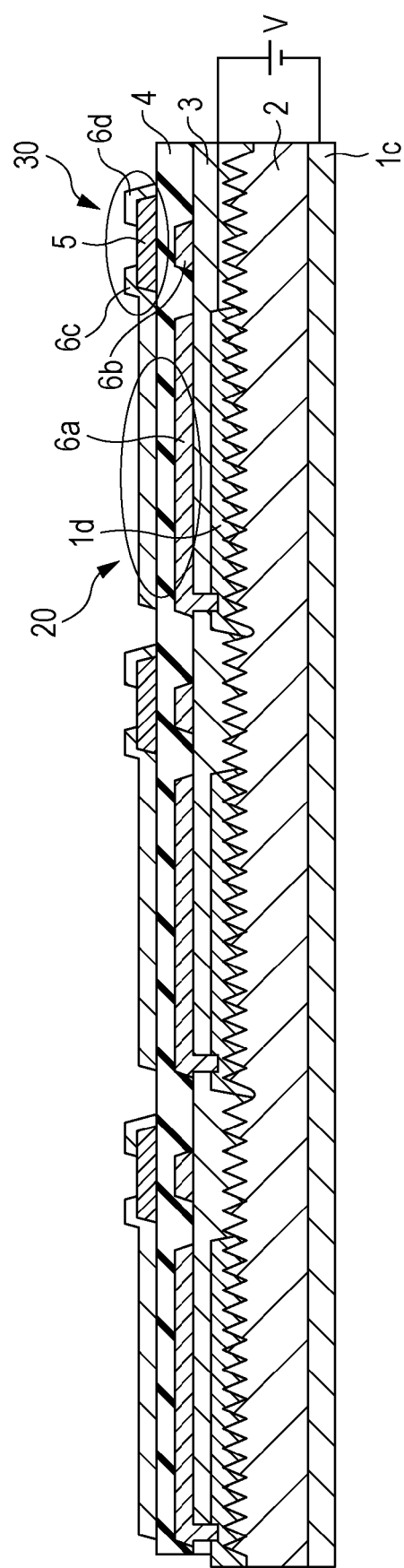
FIG. 1 is a schematic view of an X-ray detector array containing a polycrystalline oxide according to an embodiment of the present invention.

An X-ray detector array illustrated in FIG. 1 includes an X-ray photoelectric conversion layer 2, a collecting electrode 1d, a common electrode 1c, a storage capacitor 20, and a readout unit 30. The X-ray photoelectric conversion layer 2 produces electric charges in proportion to the X-ray irradiation intensity. The collecting electrode 1d collects the electric charges produced by the X-ray photoelectric conversion layer 2. The common electrode 1c is disposed on a surface of the X-ray photoelectric conversion layer 2 opposite to the collecting electrode 1d. The storage capacitor 20 stores the electric charges collected by the collecting electrode 1d. The readout unit 30 reads out the electric charges stored in the storage capacitor 20.

A voltage V is applied between the collecting electrode 1d and the common electrode 1c. The X-ray photoelectric conversion layer 2 is formed of a polycrystalline oxide.

It is desirable that the polycrystalline oxide be mainly composed of at least one of zinc oxide and cadmium oxide.

It is desirable that the readout unit 30 be a thin-film transistor (TFT), and a channel semiconductor of the TFT be amorphous In—Ga—Zn—O (Indium, Gallium, Zinc-Oxide), hereinafter also referred to as "IGZO".

It is desirable that a planarization layer 3 be formed on the polycrystalline oxide sheet (the X-ray photoelectric conversion layer 2) and the collecting electrode 1d before the storage capacitor 20 and the TFT (the readout unit) 30 are formed on the polycrystalline oxide sheet of the photoelectric conversion layer 2. It is desirable that the planarization layer 3 be formed of an organic substance, such as acrylic or polyimide.

An X-ray detector array includes an array of the storage capacitors 20 and the TFTs 30. Each of the storage capacitors 20 and the TFTs 30 corresponds to one of the collecting electrodes 1d. In FIG. 1, the storage capacitor 20 includes Mo (Molybdenum) electrodes 6a and 6c and a SiO$_2$ (Silicon Dioxide) film 4. In FIG. 1, the TFTs 30 include a channel 5 formed of amorphous In—Ga—Zn—O.

A pixel electrode 6a and a gate 6b are formed on the planarization layer 3. The pixel electrode 6a is electrically connected to the collecting electrode 1d. The SiO$_2$ film 4 is formed on the pixel electrode 6a and the gate 6b. A source 6c, a drain 6d, and the channel 5 are formed on the SiO$_2$ film 4.

A method for manufacturing the X-ray detector illustrated in FIG. 1 will be described below.

A polycrystalline oxide powder is formed into the X-ray photoelectric conversion layer 2. The X-ray photoelectric conversion layer 2 can produce electric charges in proportion to the X-ray irradiation intensity. The common electrode 1c is then formed on one surface of the X-ray photoelectric conversion layer 2, and the collecting electrode 1d is formed on the other surface. The collecting electrode 1d can collect the electric charges produced in proportion to the X-ray irradiation intensity. The planarization layer 3 is then formed with an organic substance on the X-ray photoelectric conversion layer 2 and the collecting electrode 1d. The storage capacitors 20 and the readout units (TFTs) 30 are formed on the planarization layer 3. Each of the storage capacitors 20 and the TFTs 30 corresponds to one of the collecting electrodes 1d. The storage capacitors 20 store electric charges collected by the collecting electrodes 1d. The TFTs 30 read out electric charges stored in the storage capacitors 20.

In order to prevent the thermal deterioration of the planarization layer 3, the TFTs 30 are formed on the planarization layer 3 without using a high temperature process. Thus, TFTs formable at low temperature are used. It is desirable that the maximum temperature of the TFT forming process be 300° C. or less. One type of TFTs satisfying this process condition is an amorphous In—Ga—Zn—O TFT (a TFT containing amorphous IGZO as a channel). Since amorphous IGZO is the same oxide as the polycrystalline oxide of the X-ray photoelectric conversion layer, amorphous IGZO causes negligible damage to the polycrystalline oxide under the process conditions including atmosphere. Thus, amorphous IGZO causes negligible damage to the X-ray photoelectric conversion layer in the TFT forming process.

In this manner, an X-ray detector array can be easily manufactured at low cost.

Example 2

A polycrystalline ceramic mainly composed of zinc oxide is used as the polycrystalline oxide. In—Ga—Zn—O, Zn—Sn—O, Cd—Sn—O, or Cd—Ge—O can also be used as the polycrystalline oxide. The polycrystalline ceramic is formed into a sheet. An electrode is printed on the sheet. The sheets are stacked and sintered.

Electrodes disposed between the sheets are alternately connected on the opposite sides of the sheets. A voltage is applied between the opposite sides. For example, an electrode on a sheet is connected to an electrode on the right side, and an electrode under the sheet is connected to an electrode on the left side. In the layered sheets, the electrodes are stacked in such a staggered form.

Figure 4:
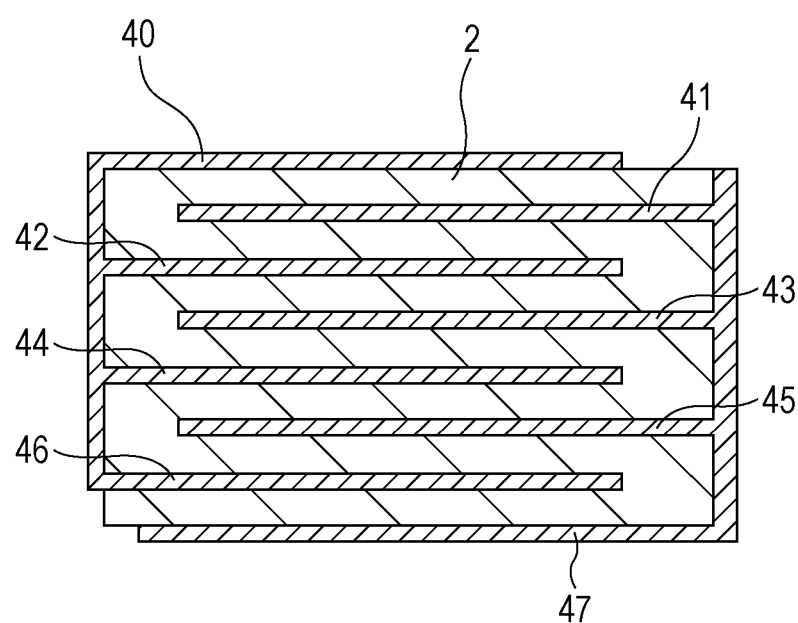
FIG. 4 is a schematic view of an X-ray detector containing polycrystalline oxide sheets according to an embodiment of the present invention.

In an example illustrated in FIG. 4, a collecting electrode 40 is disposed on a polycrystalline oxide that forms the X-ray photoelectric conversion layer 2, and a first internal electrode 41 and a second internal electrode 42 are disposed within the polycrystalline oxide of the photoelectric conversion layer 2. The collecting electrode 40 is electrically connected to the second internal electrode 42. The first internal electrode 41 is disposed between the collecting electrode 40 and the second internal electrode 42. The first internal electrode 41 is electrically connected to a common electrode 47.

In the example illustrated in FIG. 4, the left ends of a fourth internal electrode 44 and a sixth internal electrode 46 are electrically connected to the collecting electrode 40 and the second internal electrode 42. The right ends of a third internal electrode 43 and a fifth internal electrode 45 are electrically connected to the first internal electrode 41 and the common electrode 47.

In such a layered structure, the oxide X-ray photoelectric conversion layer has a small effective thickness. In other words, the distance between adjacent electrodes is small. This structure can reduce the operation voltage of the X-ray detector.

The electric current during X-ray irradiation and the suspension of irradiation is measured while a voltage of 2 V is applied to the layered structure. A molybdenum (Mo) rotating anode is used as an X-ray source. The applied voltage is 40 kV, and the applied electric current is 20 nA. The layered structure is irradiated with X-rays generated without monochromatization. FIG. 2 shows the electric current during X-ray irradiation and the suspension of irradiation. The electric current during X-ray irradiation is approximately 10 times the electric current during the suspension of irradiation, showing high X-ray detectivity.

A storage capacitor and a TFT can be formed on the layered structure to produce an X-ray detector.

Example 3

An X-ray detector array is fabricated using a layered structure in which a plurality of polycrystalline oxide sheets and a plurality of electrodes are alternately stacked.

Figure 5:
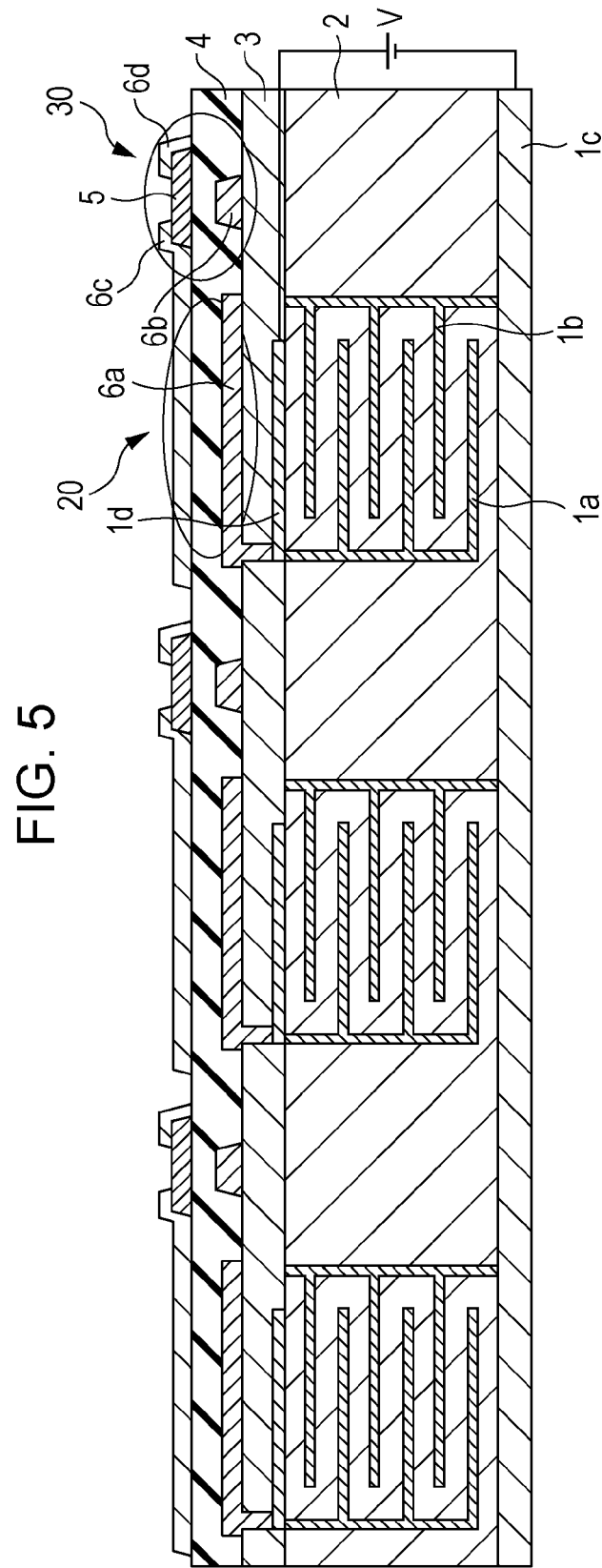
FIG. 5 is a schematic view of an X-ray detector array containing polycrystalline oxide sheets according to an embodiment of the present invention.

As illustrated in FIG. 5, a common electrode 1c and a collecting electrode 1d are formed on the opposite surfaces of a polycrystalline oxide of the X-ray photoelectric conversion layer 2 (described in Example 1 with reference to FIG. 1). An internal electrode 1b and an internal electrode 1a are formed within the polycrystalline oxide of the photoelectric conversion layer 2. The internal electrode 1b is connected to the common electrode 1c, and the internal electrode 1a is connected to the collecting electrode 1d.

As illustrated in FIG. 5, the internal electrode 1a includes three electrodes, and the internal electrode 1b also includes three electrodes. The three electrodes of the internal electrode 1a and the three electrodes of the internal electrode 1b are alternately disposed. The left ends of the three electrodes of the internal electrode 1a are connected to the collecting electrode 1d through a via hole formed in the polycrystalline oxide of the photoelectric conversion layer 2. The right ends of the three electrodes of the internal electrode 1b are connected to the common electrode 1c through a via hole formed in the polycrystalline oxide of the photoelectric conversion layer 2.

A planarization layer 3, a storage capacitor 20, and a TFT 30 are formed on the layered structure in the same manner as in Example 1. A Mo electrode (pixel electrode) 6a of the storage capacitor 20 is connected to the collecting electrode 1d. Thus, an X-ray detector array that can operate at a low applied voltage is easily fabricated at low cost.

Example 4

A substance having a density higher than a polycrystalline oxide of the photoelectric conversion layer 2 is inserted between the polycrystalline oxides to fabricate an X-ray detector or an X-ray detector array that can acquire information on the X-ray wavelength (energy).

Figure 6:
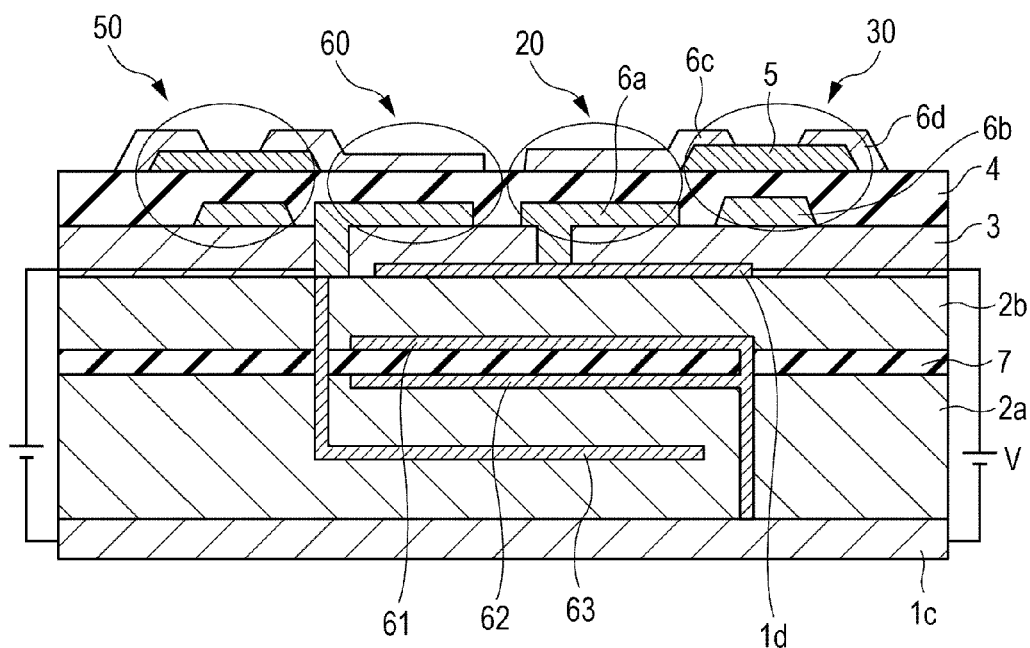
FIG. 6 is a schematic view of an X-ray detector containing polycrystalline oxide sheets according to an embodiment of the present invention.

In FIG. 6, a high-density substance layer 7 is inserted into a polycrystalline oxide of the photoelectric conversion layer 2, thereby forming a lower X-ray photoelectric conversion layer 2a and an upper X-ray photoelectric conversion layer 2b. A plurality of high-density substance layers 7 may be inserted.

A first internal electrode 61, a second internal electrode 62, and a third internal electrode 63 are formed within the polycrystalline oxide of X-ray photoelectric conversion layer 2. The first internal electrode 61 and the second internal electrode 62 are electrically connected to a common electrode 1c.

Electric charges produced between a collecting electrode 1d and the first internal electrode 61 are collected by the collecting electrode 1d. Electric charges produced between the second internal electrode 62 and the third internal electrode 63 are collected by the third internal electrode 63.

The collecting electrode 1d is electrically connected to a first storage capacitor 20. The third internal electrode 63 is electrically connected to a second storage capacitor 60.

It is desirable that a layer (high-density substance layer 7) formed of a substance having a density higher than the polycrystalline oxide of the X-ray photoelectric conversion layer 2 be inserted between the first internal electrode 61 and the second internal electrode 62. A plurality of high-density substance layers 7 may be inserted between the first internal electrode 61 and the second internal electrode 62.

The high-density substance layer 7 is an insulator mainly composed of an element having an atomic number higher than the polycrystalline oxide of the X-ray photoelectric conversion layer 2. It is desirable that the high-density substance layer 7 be formed of an oxide, such as $HfO_2$ (hafnium oxide) or $Ta_2O_5$ (tantalum pentoxide).

When X-rays are emitted from the bottom in FIG. 6, a lower X-ray photoelectric conversion layer 2a detects X-rays having a wavelength equal to or shorter than the absorption wavelength of the polycrystalline oxide of the photoelectric conversion layer 2.

An upper X-ray photoelectric conversion layer 2b detects X-rays having a wavelength equal to or shorter than the absorption wavelength of the high-density substance layer 7.

Since the absorption wavelength of the high-density substance layer 7 is shorter than the absorption wavelength of the oxide of the photoelectric conversion layers 2a and 2b, an X-ray detector including the X-ray photoelectric conversion layer 2b detects the irradiation dose of X-rays having a shorter wavelength than an X-ray detector including the X-ray photoelectric conversion layer 2a.

Thus, the comparison of the irradiation dose of X-rays detected by the X-ray detector including the X-ray photoelectric conversion layer 2b with the irradiation dose of X-rays detected by the X-ray detector including the X-ray photoelectric conversion layer 2a allow not only detection of the irradiation dose associated with the entire radiation intensity of X-rays emitted but also detection of the irradiation dose associated with the wavelength of the emitted X-rays.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-006233 filed Jan. 14, 2010, which is hereby incorporated by reference herein in its entirety.

What is claimed is:

1. An X-ray detector comprising:
    an X-ray photoelectric conversion layer configured to produce electric charges in proportion to X-ray irradiation incident thereupon;
    a collecting electrode configured to collect the electric charges produced by the X-ray photoelectric conversion layer;
    a common electrode disposed on a surface of the X-ray photoelectric conversion layer opposite to the collecting electrode;
    a storage capacitor configured to store the electric charges collected by the collecting electrode; and
    a readout unit configured to read out the electric charges stored in the storage capacitor,
    wherein a voltage is to be applied between the collecting electrode and the common electrode, and the X-ray photoelectric conversion layer is formed of a polycrystalline oxide.

2. The X-ray detector according to claim 1, wherein the polycrystalline oxide is mainly composed of at least one of zinc oxide and cadmium oxide.

3. The X-ray detector according to claim 1, wherein the readout unit is a thin-film transistor, and a channel semiconductor of the thin-film transistor is amorphous In—Ga—Zn—O.

4. The X-ray detector according to claim 1, further comprising a planarization layer on the polycrystalline oxide, the planarization layer being formed of an organic substance, wherein the storage capacitor and the readout unit are disposed on the planarization layer.

5. The X-ray detector according to claim 1, further comprising:
    a first internal electrode and a second internal electrode in the polycrystalline oxide,
    wherein the collecting electrode is electrically connected to the second internal electrode,
    the first internal electrode is disposed between the collecting electrode and the second internal electrode, and
    the first internal electrode is electrically connected to the common electrode.

6. The X-ray detector according to claim 1, further comprising:

a first internal electrode, a second internal electrode, and a third internal electrode in the polycrystalline oxide, wherein the first internal electrode and the second internal electrode are electrically connected to the common electrode, electric charges produced between the collecting electrode and the first internal electrode are collected by the collecting electrode, electric charges produced between the second internal electrode and the third internal electrode are collected by the third internal electrode, and the collecting electrode is electrically connected to a first storage capacitor, and the third internal electrode is electrically connected to a second storage capacitor.

7. The X-ray detector according to claim 6, further comprising at least one layer between the first internal electrode and the second internal electrode, the at least one layer being formed of a substance having a higher density than the polycrystalline oxide.

8. A method for manufacturing an X-ray detector, comprising:

forming a polycrystalline oxide powder into an X-ray photoelectric conversion layer configured to produce electric charges in proportion to X-ray irradiation incident on the layer;

forming a common electrode on one surface of the X-ray photoelectric conversion layer;

forming a collecting electrode on the other surface of the X-ray photoelectric conversion layer, the collecting electrode being configured to collect the electric charges produced in proportion to X-ray irradiation intensity;

forming a planarization layer made of an organic substance on the X-ray photoelectric conversion layer and the collecting electrode; and forming a storage capacitor and a readout unit on the planarization layer in a one-to-one correspondence with the collecting electrode, wherein the storage capacitor being configured to store the electric charges collected by the collecting electrode, and the readout unit being configured to read out the electric charges stored in the storage capacitor.

9. The method for manufacturing an X-ray detector according to claim 8, wherein forming the readout unit includes forming a thin-film transistor, and the thin-film transistor is formed at a temperature of 300° C. or less.

10. The method for manufacturing an X-ray detector according to claim 9, wherein a channel semiconductor of the thin-film transistor is formed by a process involving the formation of an amorphous In—Ga—Zn—O film by sputtering.

* * * * *